(12) United States Patent
Kubena et al.

(10) Patent No.: US 6,630,367 B1
(45) Date of Patent: Oct. 7, 2003

(54) SINGLE CRYSTAL DUAL WAFER, TUNNELING SENSOR AND A METHOD OF MAKING SAME

(75) Inventors: Randall L. Kubena, Oak Park, CA (US); Michael J. Little, Woodland Hills, CA (US); Leroy H. Hackett, Woodland Hills, CA (US)

(73) Assignees: HRL Laboratories, LLC, Malibu, CA (US); Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/629,684

(22) Filed: Aug. 1, 2000

(Under 37 CFR 1.47)

(51) Int. Cl.$^7$ .............................................. H01L 21/00
(52) U.S. Cl. ........................................... 438/48; 438/52
(58) Field of Search ....................... 438/48, 510, 52; 257/415; 355/71; 73/105, 418

(56) References Cited

U.S. PATENT DOCUMENTS

| | | | |
|---|---|---|---|
| 5,015,850 A | 5/1991 | Zdeblick et al. ............. 250/306 |
| 5,210,714 A | 5/1993 | Pohl et al. ................... 365/157 |
| 5,226,321 A | 7/1993 | Varnham et al. |
| 5,265,470 A | * 11/1993 | Kaiser et al. ............. 73/178 R |
| 5,313,835 A | 5/1994 | Dunn .......................... 73/505 |
| 5,354,985 A | * 10/1994 | Quate ........................ 250/234 |
| 5,475,318 A | * 12/1995 | Marcus et al. ............. 219/543 |
| 5,659,195 A | * 8/1997 | Kaiser et al. ............. 257/415 |
| 5,665,253 A | 9/1997 | Kubena et al. ............. 216/41 |
| 5,666,190 A | 9/1997 | Quate et al. ............. 355/71 |
| 5,747,804 A | 5/1998 | Williams et al. |
| 5,883,387 A | * 3/1999 | Matsuyama et al. ....... 250/306 |
| 5,894,090 A | 4/1999 | Tang et al. ............. 73/504.02 |
| 5,929,497 A | 7/1999 | Chavan et al. ............. 257/417 |
| 5,994,750 A | 11/1999 | Yagi ........................ 257/415 |
| 6,075,585 A | * 6/2000 | Minne et al. ............... 355/71 |
| 6,091,125 A | 7/2000 | Zavracky ................... 257/417 |
| 6,092,423 A | 7/2000 | Beardmore ................. 73/704 |
| 6,174,820 B1 | 1/2001 | Habermehl et al. ......... 438/745 |
| 6,211,532 B1 | 4/2001 | Yagi .......................... 257/40 |
| 6,229,190 B1 | 5/2001 | Bryzek et al. ............. 257/419 |
| 6,296,779 B1 | 10/2001 | Clark et al. .................. 216/66 |
| 6,337,027 B1 | 1/2002 | Humphrey ................... 216/2 |

FOREIGN PATENT DOCUMENTS

| | | |
|---|---|---|
| DE | 43 05 033 A1 | 10/1993 |
| EP | 0 619 495 A1 | 10/1994 |
| JP | 04-369418 | 12/1992 |
| JP | 08-203417 | 8/1996 |
| WO | 97/10698 | 3/1997 |

OTHER PUBLICATIONS

Cheng et al., Localized Silicon Fusion and Eutectic Bonding for MEMS Fabrication and Packaging, Mar. 2000, IEEE, Journal of Microelecromechanical Systems, vol. 9, pp 3–8.*

(List continued on next page.)

*Primary Examiner*—William David Coleman
(74) *Attorney, Agent, or Firm*—Ladas & Parry

(57) ABSTRACT

A method of making a micro electro-mechanical switch or tunneling sensor. A cantilevered beam structure and a mating structure are defined on a first substrate or wafer; and at least one contact structure and a mating structure are defined on a second substrate or wafer, the mating structure on the second substrate or wafer being of a complementary shape to the mating structure on the first substrate or wafer. A bonding layer, preferably a eutectic bonding layer, is provided on at least one of the mating structures. The mating structure of the first substrate is moved into a confronting relationship with the mating structure of the second substrate or wafer. Pressure is applied between the two substrates so as to cause a bond to occur between the two mating structures at the bonding or eutectic layer. Then the first substrate or wafer is removed to free the cantilevered beam structure for movement relative to the second substrate or wafer.

51 Claims, 12 Drawing Sheets

OTHER PUBLICATIONS

Grade, John, et al., "Wafer–Scale Processing, Assembly, and Testing of Tunneling Infrared Detectors", Transducers '97, 1997 International Conference on Solid State Sensors and Actuators, Chicago, Jun. 16–19, pp. 1241–1244.

Kenny, T.W. et al., Micromachined Silicon Tunnel Sensor for Motion Detection, Appl. Phys. Lett., vol. 58, No. 1, Jan. 7, 1991, pp. 100–102.

Yeh, et al., "A Low voltage Bulk–Silicon Tunneling–Based Microaccelerometer", IEEE, 1995 pp. 23.1.1–23.1.4.

Grétillat, F., et al., "Improved Design of a Silicon Micromachined Gyroscope with Piezoresistive Detection and Electromagnetic Excitation," *IEEE Journal of Microelectromechanical Systems*, vol. 8, No. 3, pp 243–250 (Sep. 1999).

Abstract of JP 04–369418, *Patent Abstracts of Japan*, vol. 017, No. 250, May 18, 1993.

Abstract of JP 08–203417, *Patent Abstracts of Japan*, vol. 1996, No. 12, Dec. 26, 1996.

Kubena, R.L., et al., "A New Miniaturized Surface Micromachined Tunneling Accelerometer," *IEEE Electron Device Letters*, vol. 17, No. 6, pp. 306–308 (Jun. 1996).

Kubena, R.L., et al., "New Miniaturized tunneling–based gyro for inertial measurement applications," 43rd *Journal of Vacuum Science & Technology B (Microelectronics and Nanometer Structures*, vol. 17, No. 6, pp. 2948–2952 (Nov./Dec. 1999).

Liu, C–H, et al., "Characterization of a High–Sensistivity Micromachined Tunneling Accelerometer with Micro–g Resolution," *Journal of Microelectromechanical Systems*, vol. 7, No. 2, pp. 235–243 (Jun. 1998).

Motamedi, M.E., et al., "Tunneling Tip Engine for Microsensors Applications," *Materials and Device Characterization in Micromachining II—Proceedings of the SPIE*, Santa Clara, California, vol. 3875, pp. 192–199 (Sep. 1999).

\* cited by examiner

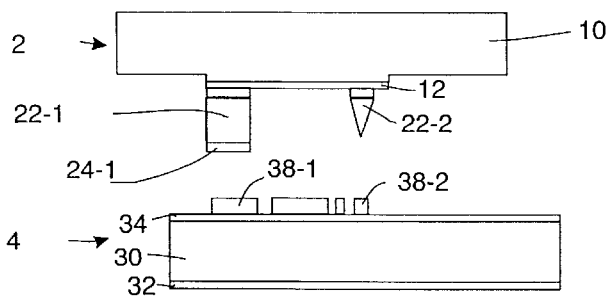
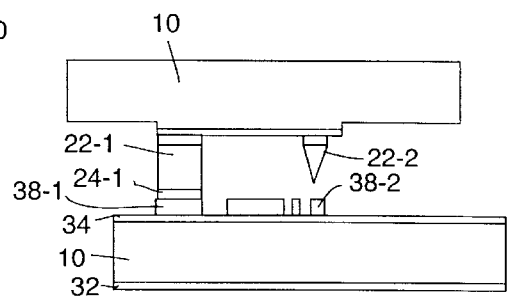
Figure 10         Figure 11
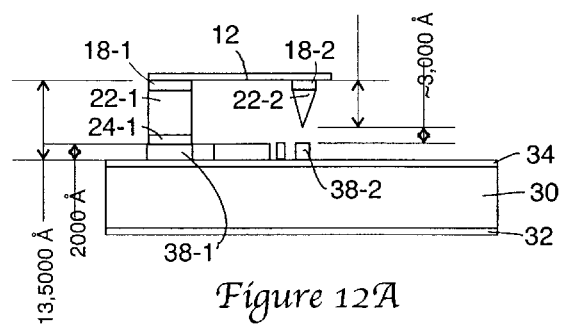
Figure 12A
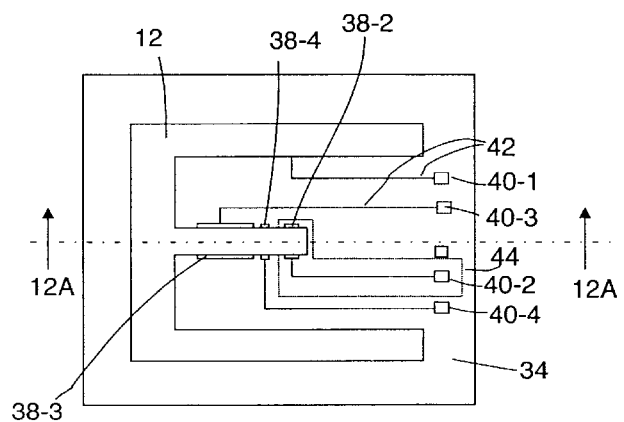
Figure 12B

 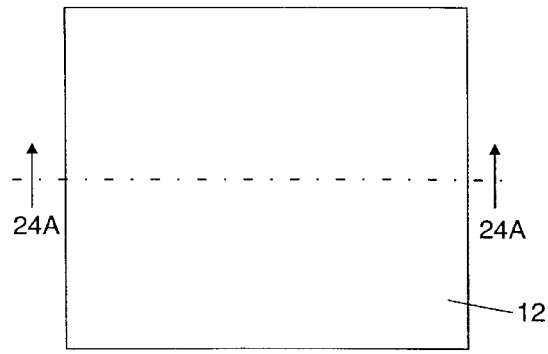
Figure 24A    Figure 24B
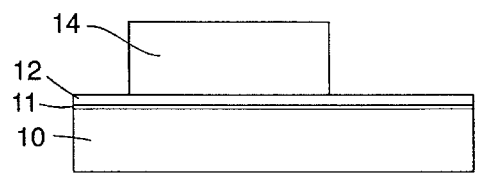 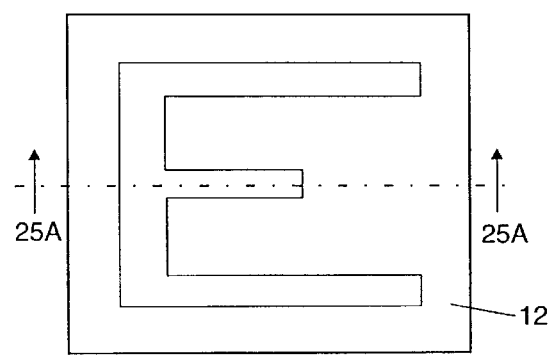
Figure 25A    Figure 25B
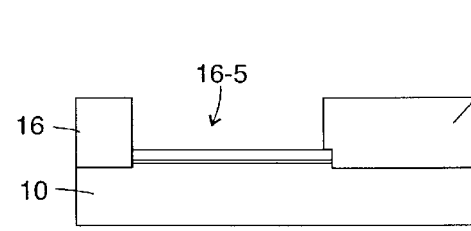 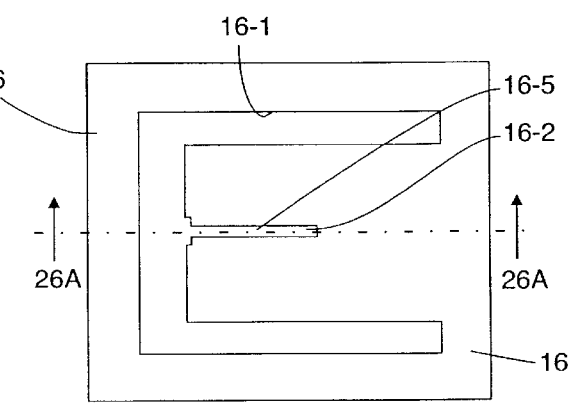
Figure 26A    Figure 26B

SINGLE CRYSTAL DUAL WAFER, TUNNELING SENSOR AND A METHOD OF MAKING SAME

RELATED APPLICATIONS

This invention is related to other inventions which the subject of separate patent applications filed thereon. See: U.S. patent application Ser. No. 09/629,682 entitled "A Single Crystal, Dual Wafer, Tunneling Sensor or Switch with Silicon on Insulator Substrate and a Method of Making Same" and U.S. patent application Ser. No. 09/629,680 entitled "A Single Crystal, Dual Wafer, Tunneling Sensor or Switch with Substrate Protrusion and a Method of Making Same" both of which applications have the same filing date as this application. The inventors named in this application are the inventors of the first embodiment disclosed herein with reference to FIGS. 1A–12B. However, subsequent improvements have been made which reflect what is believed to be the best modes for practicing the invention. As such, this application includes a disclosure of those improvements in the embodiments after FIG. 12B to ensure that the best mode requirements of 35 USC 111 first paragraph have been satisfied.

TECHNICAL FIELD

The present invention relates to micro electro-mechanical (MEM) tunneling sensors using dual wafers which are bonded together preferably eutectically.

BACKGROUND OF THE INVENTION

The present invention provides a new process of fabricating a single crystal silicon MEM tunneling devices using low-cost bulk micromachining techniques while providing the advantages of surface micromachining. The prior art, in terms of surface micromachining, uses e-beam evaporated metal that is patterned on a silicon dioxide ($SiO_2$) layer to form the control, self-test, and tip electrodes of a tunneling MEM sensor. A cantilevered beam is then formed over the electrodes using a sacrificial resist layer, a plating seed layer, a resist mold, and metal electroplating. Finally, the sacrificial layer is removed using a series of chemical etchants. The prior art for bulk micromachining has utilized either mechanical pins and/or epoxy for the assembly of multi-Si wafer stacks, a multi-Si wafer stack using metal-to-metal bonding and an active sandwiched membrane of silicon nitride and metal, or a dissolved wafer process on quartz substrates (Si-on-quartz) using anodic bonding. None of these bulk micromachining processes allow one to fabricate a single crystal Si cantilever (with no deposited layers over broad areas on the beam which can produce thermally mismatched expansion coefficients) above a set of tunneling electrodes on a Si substrate and also electrically connect the cantilever to pads located on the substrate. The fabrication techniques described herein provide these capabilities in addition to providing a low temperature process so that CMOS circuitry can be fabricated in the Si substrate before the MEMS sensors are added. Finally, the use of single crystal Si for the cantilever provides for improved process reproducibility for controlling the stress and device geometry.

Tunneling sensors may be used in various military, navigation, automotive, and space applications. Space applications include satellite stabilization in which MEM sensor technology can significantly reduce the cost, power, and weight of the presently used gyro systems. Automotive air bag deployment, ride control, and anti-lock brake systems provide other applications for MEM sensors. Military applications include high dynamic range accelerometers and low drift gyros.

BRIEF DESCRIPTION OF THE INVENTION

Generally speaking, the present invention provides a method of making a micro electro-mechanical sensor wherein a cantilevered beam structure and a mating structure are defined on a first substrate or wafer and at least one contact structure and a mating structure are defined on a second substrate or wafer. The mating structure on the second substrate or wafer is of a complementary shape to the mating structures on the first substrate or wafer. A bonding or eutectic layer is provided on at least one of the mating structures and the mating structure are moved into a confronting relationship with each other. Pressure is then applied between the two substrates and heat may also be applied so as to cause a bond to occur between the two mating structures at the bonding or eutectic layer. Then the first substrate or wafer is removed to free the cantilevered beam structure for movement relative to the second substrate or wafer. The bonding or eutectic layer also provides a convenient electrical path to the cantilevered beam for making a circuit with the contact formed on the cantilevered beam.

In another aspect, the present invention provides an assembly or assemblies for making a single crystal silicon MEM sensor therefrom. A first substrate or wafer is provided upon which is defined a beam structure and a mating structure. A second substrate or wafer is provided upon which is defined at least one contact structure and a mating structure, the mating structure on the second substrate or wafer being of a complementary shape to the mating structure on the first substrate or wafer. A pressure and heat sensitive bonding layer is disposed on at least one of the mating structures for bonding the mating structure defined on the first substrate or wafer with the mating structure on the second substrate in response to the application of pressure and heat therebetween.

BRIEF DESCRIPTION OF THE FIGURES

FIGS. 1A through 6A depict the fabrication of a first embodiment of the cantilever portion of a MEM sensor.

FIGS. 1B through 6B correspond to FIGS. 1A–6A, but show the cantilever portion, during its various stages of fabrication, in plan view:

FIGS. 7A through 9A show, in cross section view, the fabrication of the base portion of the first embodiment tunneling sensor;

FIGS. 7B through 9B correspond to FIGS. 7A–9A but show the fabrication process for the base portion in plan view;

FIGS. 10 and 11 show the cantilever portion and the base portion being aligned with each other and being bonded together preferably by eutectic bonding;

FIGS. 12A and 12B show in a cross sectional view and in a plan view the completed tunneling sensor according to the first embodiment of the invention:

FIGS. 15A–19A depict, in cross section view, the fabrication of the base portion of the second embodiment of the tunneling sensor;

FIGS. 15B–19B correspond to FIGS. 15A–19A, but show the fabrication process for the second embodiment of the wafer in plan view;

FIGS. 22A and 23 show the completed MEM sensor according to the second embodiment in cross sectional view, while

FIGS. 24A through 29A depict, in cross sectional view, a modification applicable to both the first and second embodiments of the cantilever portion of the MEM sensor;

FIGS. 24B through 29B correspond to FIGS. 24A–29A, but show the fabrication process for the modification in plan view;

DETAILED DESCRIPTION

Several embodiments of the invention will be described with respect to the aforementioned figures. The first embodiment will be described with reference to FIGS. 1A through 15. A second embodiment will be discussed with reference to FIGS. 16 through 23. Further additional embodiments and modifications are described thereafter. Since some of the fabrication steps are the same for many of the embodiments, reference will often be made to earlier discussed embodiments to reduce repetition. For example, the second embodiment makes reference to FIGS. 1A–4B when describing the second embodiment to reduce repetition of that material.

The MEM devices shown in the accompanying figures are not drawn to scale, but rather are drawn to depict the relevant structures for those skilled in this art. Those skilled in this art realize that these devices, while mechanical in nature, are very small and are typically manufactured using generally the same type of technology used to produce semiconductor devices. Thus a thousand or more devices might well be manufactured at one time on a silicon wafer. To gain an appreciation of the small scale of these devices, the reader may wish to turn to FIG. 15 which includes size information for a preferred embodiment of a MEM sensor utilizing the present invention.

Figure 1A:
Figure 1B:
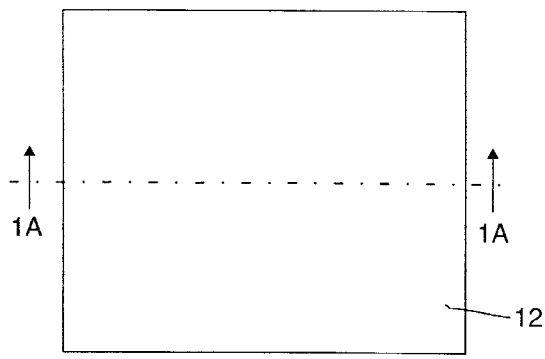

Turning to FIGS. 1A and 1B, a starting wafer for the fabrication of the cantilever is depicted. The starting wafer includes a wafer of bulk n-type silicon (Si) 10 upon which is formed a thin layer of doped p-type silicon 12. The silicon wafer 10 is preferably of a single crystalline structure having a <100> crystalline orientation. The p-type silicon layer 12 is preferably grown as an epitaxial layer on silicon wafer 10. The layer 12 preferably has a thickness of in the range of 1 to 20 micrometers ($\mu$m), but can have a thickness anywhere in the range of 0.1 $\mu$m to 800 $\mu$m. Generally speaking, the longer the cantilevered beam is the thicker the beam is. Since layer 12 will eventually form the cantilevered beam, the thickness of layer 12 is selected to suit the length of the beam to be formed.

Layer 12 is doped with Boron such that its resistivity is reduced to less than 0.05 $\Omega$-cm and is preferably doped to drop its resistivity to the range of 0.01 to 0.05 $\Omega$-cm. The resistivity of the bulk silicon wafer or substrate 10 is preferably about 10 $\Omega$-cm. Boron is a relatively small atom compared to silicon, and therefore including it as a dopant at the levels needed ($10^{20}$) in order to reduce the resistivity of the layer 12 tends to induce stress which is preferably compensated for by also doping, at a similar concentration level, a non-impurity atom having a larger atom size, such as germanium. Germanium is considered a non-impurity since it neither contributes nor removes any electron carriers in the resulting material.

Layer 12 shown in FIGS. 1A and 1B is patterned using well known. photolithographic techniques to form a mask layer, patterned as shown at numeral 14, preferably to assume the shape of a capital letter 'E'. While the shape of the capital letter 'E' is preferred, other shapes can be used. In this embodiment, the outer peripheral portion of the E-shape will form a mating structure which will be used to join the cantilever portion of the sensor to the base portion.

Figure 2A:
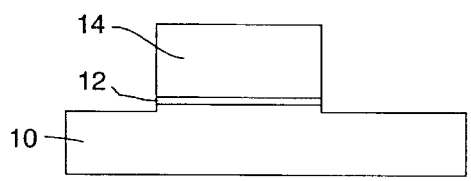
Figure 2B:
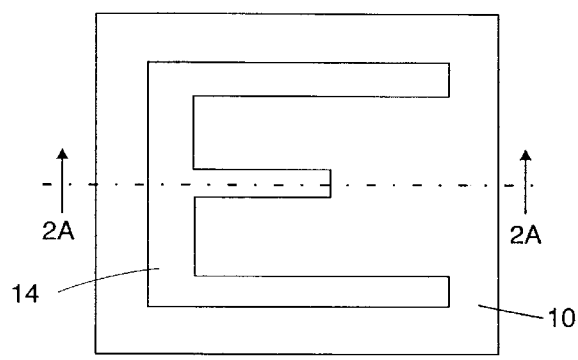

After the mask layer 14 has been patterned as shown in FIGS. 2A and 2B, the wafer is subjected to a plasma etch in order to etch through the thin layer of p-type doped silicon 12 and also to over etch into the silicon wafer 10 by a distance of approximately 500 Å.

Figure 3A:
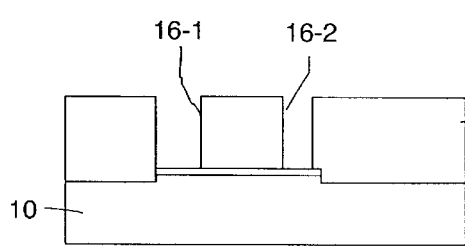
Figure 3B:
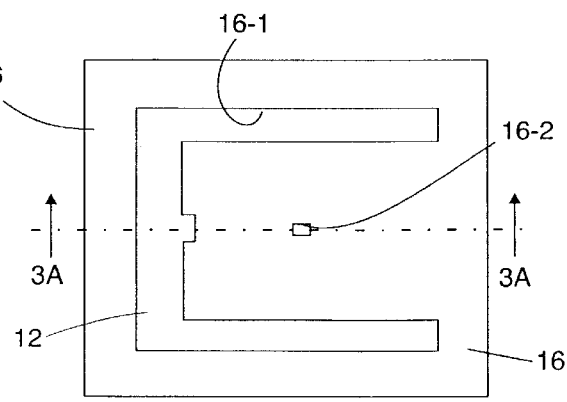

The mask 14 shown in FIGS. 2A and 2B is then removed and another photoresist layer 16 is applied which is patterned as shown in FIGS. 3A and 3B by providing two openings therein 16-1 and 16-2. Opening 16-1 basically follows the outer perimeter of the 'E' shape of the underlying thin layer of p-type silicon 12 while opening 16-2 is disposed at or adjacent a tip of the interior leg of the 'E'-shaped p-type silicon layer 12.

Layers of Ti/Pt/Au are next deposited over mask 16 and through openings 16-1 and 16-2 to form a post contact 18-1 and a tunnelling tip contact 18-2. The Ti/Pt/Au layers preferably have a total thickness of about 2000 Å. The individual layers of Ti and Pt may have thicknesses in the ranges of 100–200 Å and 1000–2000 Å, respectively. After removal of the photoresist 16, the wafer is subjected to a sintering step at approximately 520° C. to form an ohmic Ti—Si juncture between contacts 18-1 and 18-2 and the underlying layer 12.

Figure 4A:
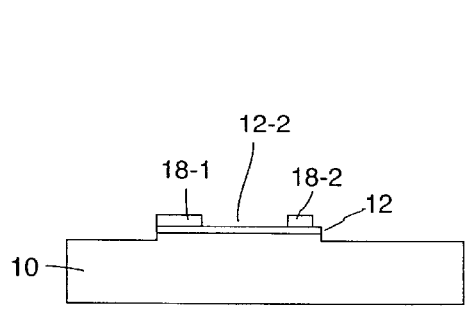
Figure 4B:
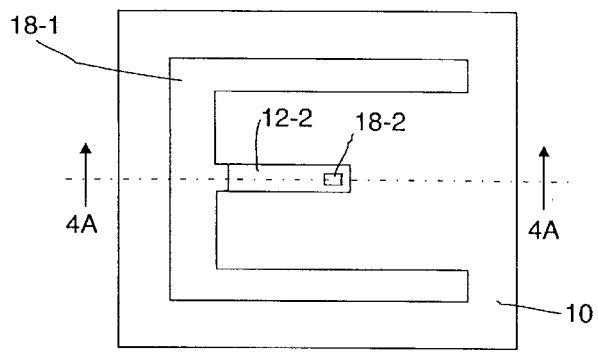
Figure 5A:
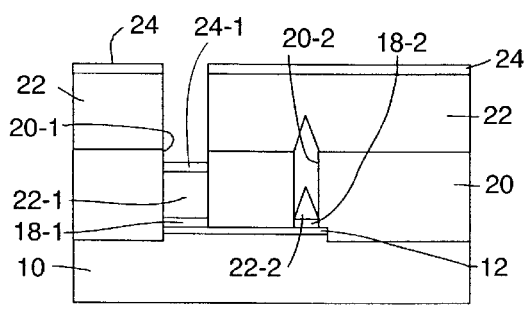
Figure 5B:
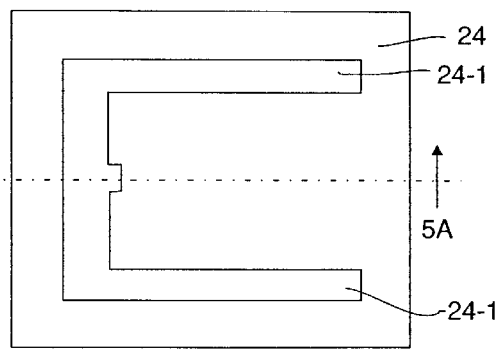

The structures shown in FIGS. 4A and 4B are then covered with a layer of photoresist 20 which, as shown in FIG. 5A, is patterned so that is assumes the same shape as did photoresist layer 16 previously discussed with reference to FIGS. 3A and 3B. Thus, photoresist layer 20 has an opening 20-1 and another opening 20-2 therein. Those skilled in the art will appreciate that the size of the openings 16-1, 16-2, 20-1 and 20-2 are not drawn to scale on the figures and that openings 16-2 and 20-2 would tend to be significantly smaller than would be openings 16-1 and 20-1. As such, when a rather thick layer of Ti/Pt/Au is deposited on the wafer, it basically fills opening 20-1 (see FIG. 5A); however, those skilled in the art will appreciate that there is some fill-in at the sides of a mask when a layer such as layer 22 is deposited because of an increasing overhang which occurs at the edges of openings 20-1 and 20-2 as the deposition process proceeds. Since the width of the opening 20-1 is quite wide, the effect of the fill-in is not particularly important. However, since opening 20-2 is rather narrow to begin with, the deposited Ti/Pt/Au 22, as shown at numeral 20-2, assumes a pyramidal-like or conical-like shape. The thickness of the deposition of Ti/Pt/Au layer 22 is sufficiently thick to assure that layer 22 will close across the top of opening 20-2 during the deposition process. Finally, a relatively thin layer, preferably about 100 Å thick, of Au/Si 24 is deposited on the structure and through opening 20-1 as depicted by numeral 24-1.

Figure 6A:
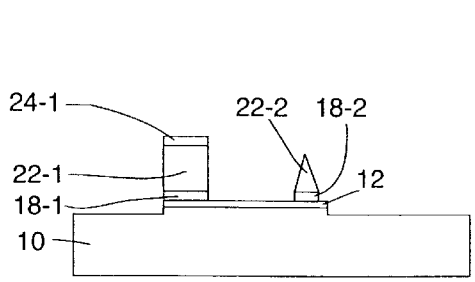
Figure 6B:
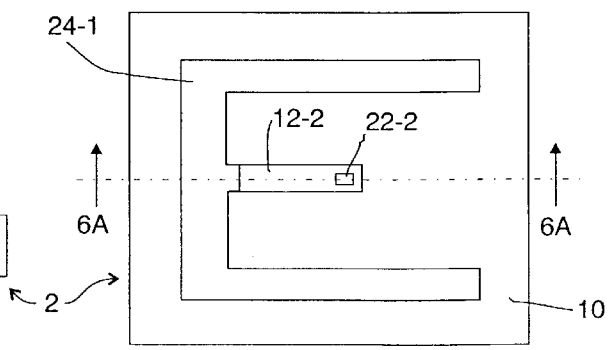

The photoresist 20 is then dissolved lifting of the layers 22 and 24 formed thereon and leaving the structure depicted by FIGS. 6A and 6B. The height of layers 22-1 and 24-1 above layer 12 is preferably on the order of 11,500 Å while the height of the pyramidal-like or conical structure 22-2 is preferable on the order of 8,500 Å. The cantilevered beam portion of the MEMS sensor of this first embodiment has now been formed, and thus we will now move onto the formation of the base structure for this first embodiment of the MEM sensor. As will be seen, layers 22-1 and 24-1 form a mating structure for mating the cantilevered beam portion with its base portion.

Figure 7A:
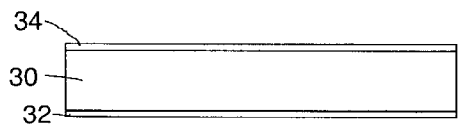
Figure 7B:
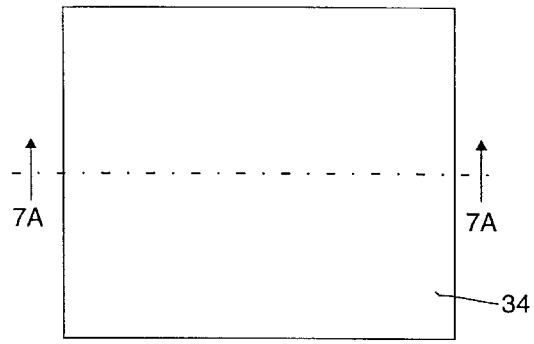
Figure 8A:
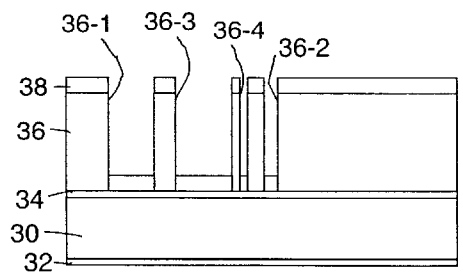
Figure 8B:
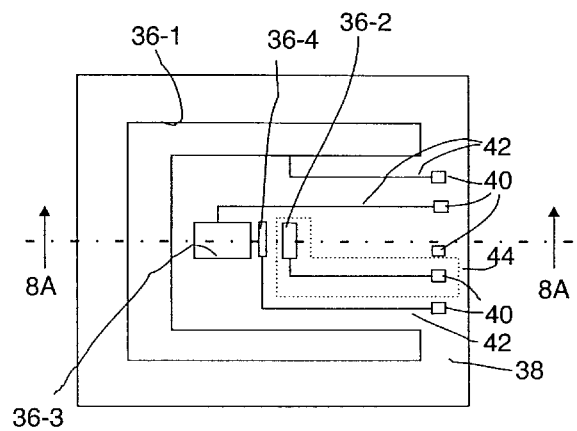

The fabrication of the base portion will now be described. Turning first to FIGS. 7A and 7B, there is shown a wafer 30 with layers of silicon dioxide 32 and 34 formed on its major surfaces. The thickness of each layer 32 and 34 is preferably on the order of 1.0 micrometers. Next, a mask is formed by a layer of photoresist 36 which is applied and patterned as shown in FIGS. 8A and 8B to form openings 36-1, 36-2, 36-3 and 36-4 therein. Opening 36-1 basically corresponds in shape and configuration to opening 16-1 discussed with reference to FIGS. 3A and 3B. Similarly, opening 36-2 basically corresponds to opening 16-2 discussed with reference to FIGS. 3A and 3B. Openings 36-3 and 36-4 allow for the deposition of control and self test electrodes 38-3 and 38-4. A layer of Ti/Pt/Au 38 is deposited on mask 36 and through the openings therein in order to form contact electrodes 38-1, 38-2, 38-3 and 38-4 on layer 34. Photoresist layer 36 also has openings in it so that when layer 38 is deposited, connection pads 40 are also formed for each one of the electrodes as well as interconnecting ribbon conductors 42. Preferably, a guard ring 44 is placed around tip electrode 36-2 and its associated ribbon conductor 42-2 and connection pad 40-2. The guard ring is not shown in the elevation views for ease of illustration.

Figure 9A:
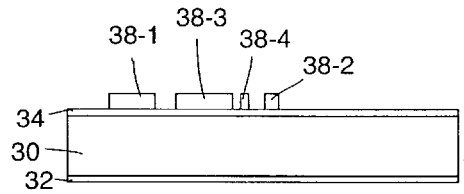
Figure 9B:
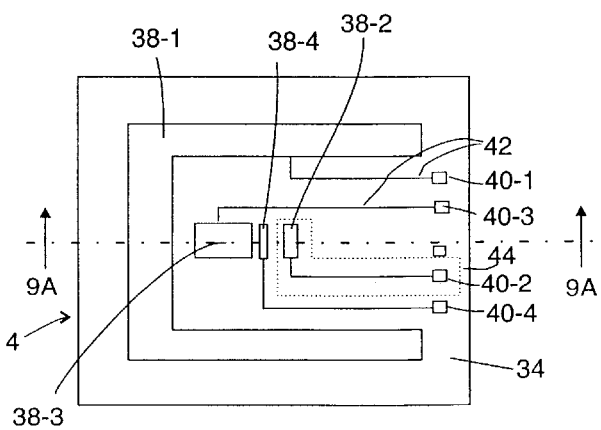

The photoresist layer 36 is then removed lifting off the layer 38 deposited thereon and leaving the structure shown in FIGS. 9A and 9B. Contact 38-1 assumes the shape of the outer periphery of a letter E and provides a mating structure for joining with the similar-shaped mating structure 22-2, 24-1 of the cantilevered beam portion 2.

Turning to FIG. 10, the cantilevered beam portion 2, preferably fabricated as described with reference to FIGS. 1A–6B, is mechanically aligned relative to the base portion 4 fabricated as described with reference to FIGS. 7A–9B. Of course, those skilled in the art will appreciate that the patterns shown on the surfaces of wafers 10 and 30 repeat many times over the surface of a wafer so that there are many cantilevered beam forming structures 2 comprising elements 22-1, 24-1, 12 and 22-2 and many corresponding base structures 4 comprising elements 38-1 through 38-4 which are manufactured for mating on the silicon wafers 10 and 30. The two wafers are brought into alignment (See FIG. 11) and subjected to pressure and heating so as to cause a eutectic bond to occur between layer 24-1 and layer 38-1. The pressure is developed preferably by applying a force of about 5,000 N at about 400° C. between three inch (7.5 cm) wafers 2,4 containing 1000 devices. Of course, the force needs to be adjusted depending on the size of the wafer and the total surface area to be bonded. If the bonding is done non-eutectically, the temperature used will be higher.

Layers 24-1 and 38-1 have preferably assumed the shape of the outer-perpherial edge of a capital letter 'E' and therefore the moveable contact 22-2 of the MEM sensor is well protected by this physical shape. After performing the bonding, silicon layer 10 is dissolved away to arrive at the resulting MEM sensor shown in FIGS. 12A and 12B. The silicon can be dissolved with ethylenediamine pyrocatechol (EDP). This leaves only the Boron doped silicon cantilevered beam 12 with its contact 22-2 and its supporting or mating structure 22-1 and 24-1 bonded to the base structure 4. Preferable dimensions for the MEM sensor are given on FIG. 12A. The beam preferably has a length of 200 to 300 µm (0.2 to 0.3 mm).

Instead of using EDP as the etchant, plasma etching can be used if a thin layer of $SiO_2$ is used, for example, as an etch stop between layer 12 and substrate 10.

A second embodiment of a MEM sensor will now be described. As in the case of the first embodiment, this discussion will begin with the fabrication of the cantilever beam portion 2, then go onto a discussion of the base portion 4 and the preferable eutectic bonding and the completion of the MEM sensor. As will be seen, this second embodiment differs from the first embodiment by the manner in which the cantilevered beam is supported above base portion 4.

According to the second embodiment, the fabrication of the cantilever beam forming structure 2 starts as has been described with reference to FIGS. 1A through 4B of the first embodiment. Assuming that the fabrication steps discussed with reference to FIGS. 1A through 4B have been carried out, the structure depicted in FIGS. 4A and 4B will been obtained.

Alternatively, post contact 18-1 may be formed by layers of Ti and Au (i.e without Pt), which would involve an additional masking step to eliminate the Pt layer from post contact 18-1. However, in this alternative, the sintering would cause Si to migrate into the Au to form an Au/Si eutectic at the exposed portion of post contact 18-1 shown in FIGS. 4A and 4B. As a further alternative, the exposed portion of the post contact 18-1 shown in FIGS. 4A and 4B could simply be deposited as Au/Si eutectic, in which case the Pt layer in the post contact 18-1 could be optionally included. Post contact 18-1 may be eliminated if the subsequently described bonding between the cantilevered beam portion 2 and the base portion 4 occurs non-eutectically.

As a result, the exposed portion of the post contact 18-1 shown in FIGS. 4A and 4B is formed, according to this embodiment preferably either by Au or by Au/Si.

Figures 13A, 13B:
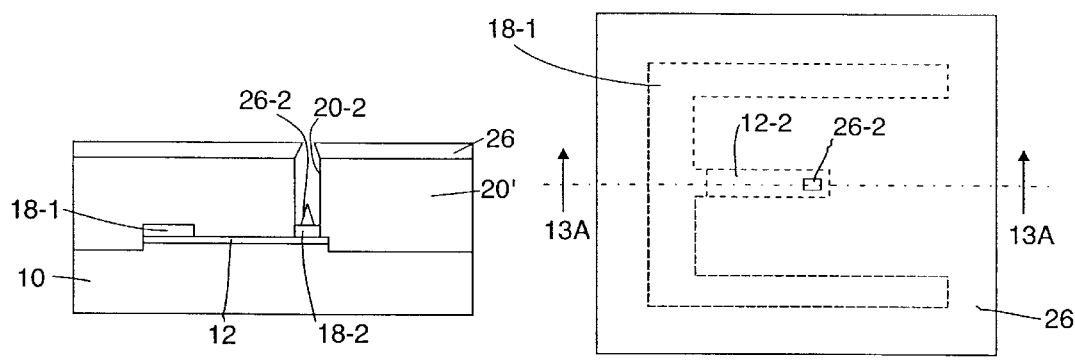
FIGS. 13A and 14A depict steps used in fabricating a second embodiment of a the cantilever portion of a MEM sensor.
FIGS. 13B and 14B correspond to FIGS. 13A and 14A, but show the cantilever portion, in plan view.
Figures 14A, 14B:
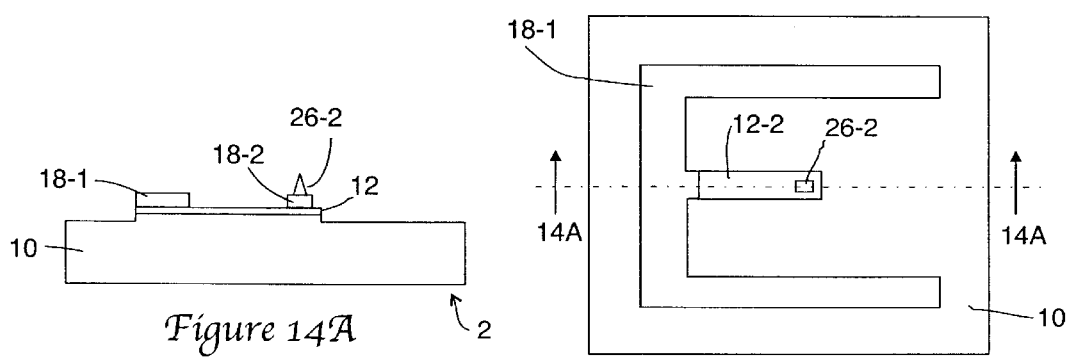

From that point, a layer of photoresist 20' is put down and patterned to have a single opening 20-2 therein as shown in FIGS. 13A and 13B. A layer of gold 26, having a thickness of 15,000 Å, is applied over the photoresist 20' and the gold, as it deposits upon contact 18-2 through opening 20-2, will assume a pyramidal-like or conical-like shape so as to form a pointed contact 26-2 due to the formation of an overhang at the opening 20-2 during the deposition of the gold layer 26. After contact 26-2 is formed, the remaining photoresist 20' is dissolved so that the cantilever beam structure then appears as shown in FIGS. 14A and 14B. Comparing FIGS. 14A and 14B of the second embodiment with FIGS. 6A and 6B of the first embodiment, the primary difference between the two embodiments is the absence of layers 22-1 and 24-1 in the second embodiment, so that the mating structure is provided by layer 18-1 in this embodiment.

Figures 15A, 15B:
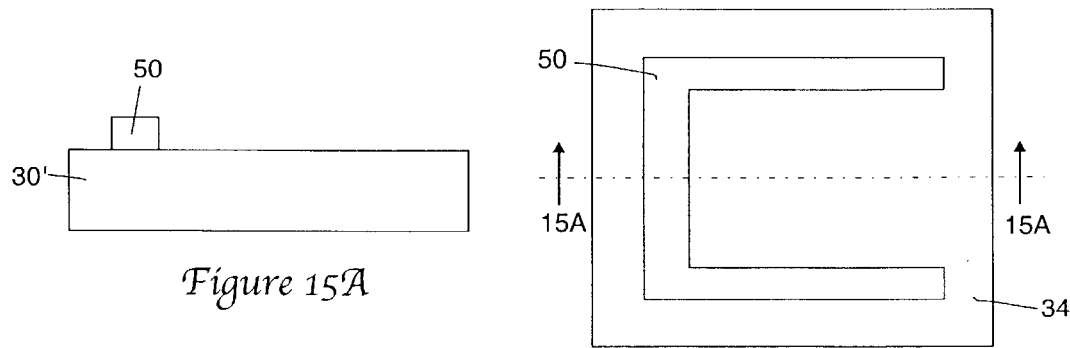
Figure 16A:
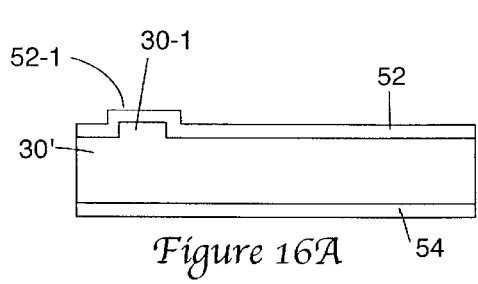
Figure 16B:
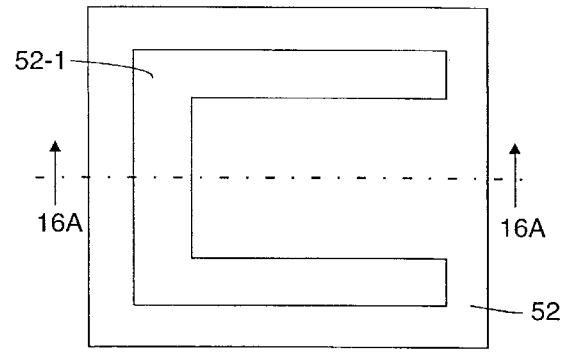

The fabrication of the base portion 4 of the second embodiment of the MEM sensor will now be described with reference to FIGS. 15A through 19B. Turning to FIGS. 15A and 15B, a wafer 30' of silicon is shown upon which a layer of photoresist 50 has been deposited and patterned to assume preferably the outerperipheral shape of a capital letter 'E'. The exposed silicon is then subjected to an etch, etching it back approximately 20,000 Å, to define a protruding portion 30-1 of wafer 30' under the patterned mask 50 of the photoresist. The photoresist mask 50 is then removed and wafer 30 is oxidized to form layers of oxide 52, 54 on its exposed surfaces. The oxide layers are each preferably about 1 µm thick. Of course, the end surfaces shown in FIG. 16A are not shown as being oxidized because it is assumed that the pattern shown in FIG. 16A is only one of a number of repeating patterns occurring across an entire wafer 30'.

Figure 17A:
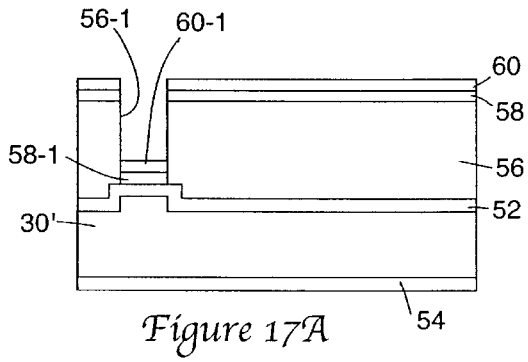
Figure 17B:
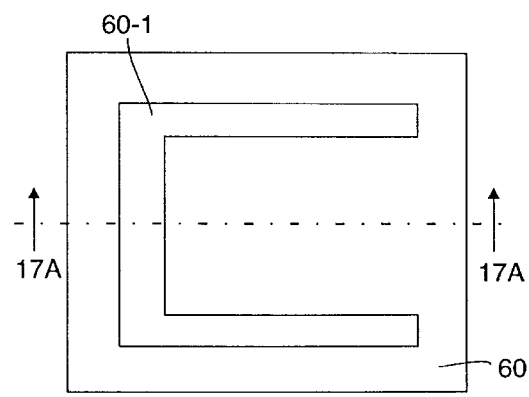

Turning to FIGS. 17A and 17B, a layer of photoresist 56 is applied having an opening therein 56-1 which again assumes the outerperipheral shape of a capital letter 'E', as previously described. Then, a layer of Ti/Pt/Au 58, preferably having a thickness of 2,000 Å, is deposited through opening 56-1 followed by the deposition of a layer 60 of an Au/Si eutectic preferably with a 1,000 Å thickness. Layers 58-1 of Ti/Pt/Au and 60-1 of the Au/Si eutectic are thus formed, which layers preferably follow the outerperipheral shape of a capital letter 'E', as previously described. Of course, if the post contact 18-1 is formed of an Au/Si eutectic, then layer 60 may be formed of simply Au or simply omitted due to the presence of Au at the exposed layer 58-1.

Figure 18A:
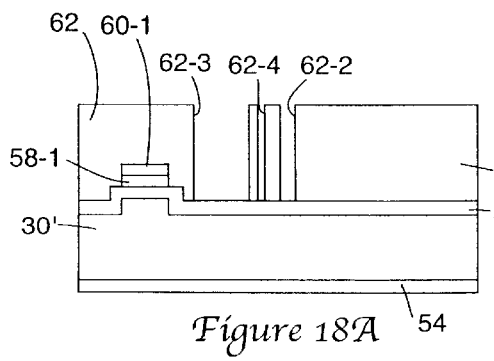
Figure 18B:
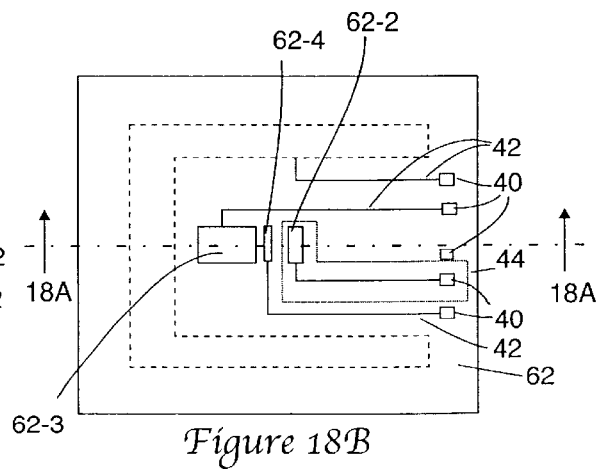
Figure 19A:
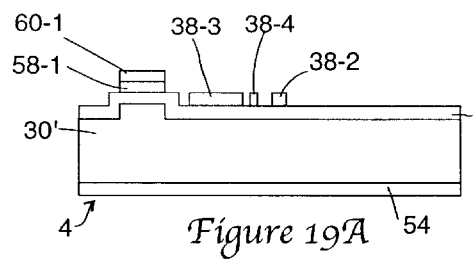
Figure 19B:
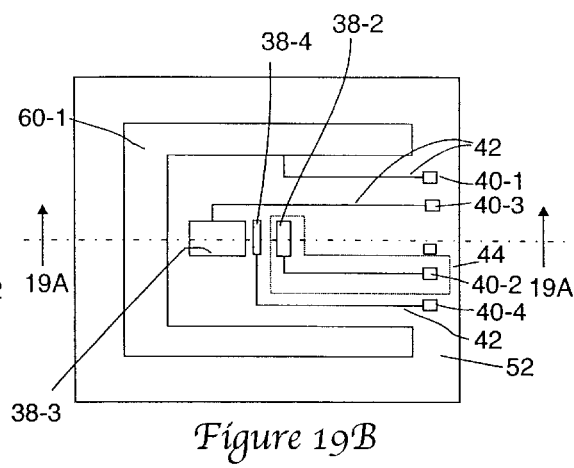

Photoresist layer 56 is then removed and a layer 62 of photoresist is applied and patterned to have (i) openings 62-2, 62-3 and 62-4, as shown in FIG. 18A, (ii) openings for pads 40-1 through 40-4 and their associated ribbon conductors 42 and (iii) an opening for guard ring 44 and its pad, as depicted in FIG. 18B. For the ease of illustration, the opening for guard ring 44 is not shown in FIG. 18A. As is shown by FIGS. 19A and 19B, a layer 38 of Ti/Pt/Au is deposited over the photoresist and through openings 62-2 through 62-4 forming contacts 38-3, 38-4 and 38-2 as shown in FIGS. 19A and 19B. Those contacts are interconnected with their associated pads 40-2 through 44-4 by the aforementioned ribbon conductors 42, which contacts 40 and ribbon conductors 42 are preferably formed at the same time as contacts 38-3, 38-4 and 38-2 are formed. The outerperipheral layers 58-1 and 60-1 are also connected with pad 40-1 by an associated ribbon conductor 42. The layer 62 of photoresist is removed so that the base portion appears as shown in FIGS. 19A and 19B. The protrusion 30-1, which preferably extends approximately 20,000 Å high above the adjacent portions of wafer 30', and the relatively thin layers 58-1 and 60-1 form the mating structure for the base portion 4.

Figure 20:
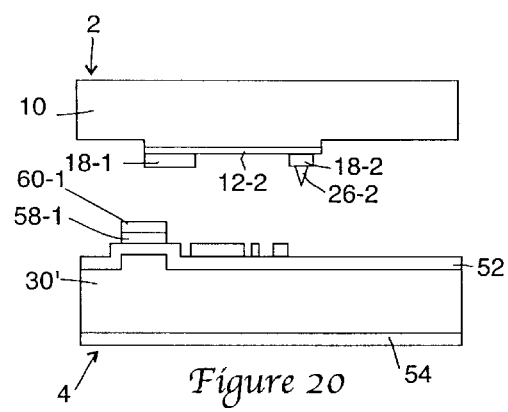
FIGS. 20 and 21 show the cantilever and base portion embodiment being aligned with each other and bonded together preferably by eutectic bonding.
Figure 21:
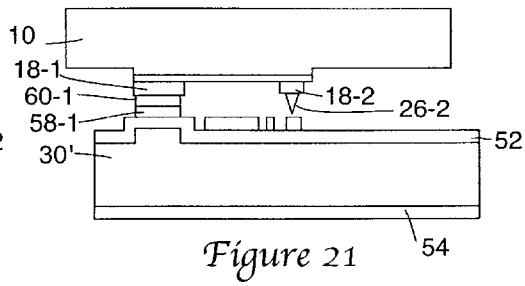
Figure 22A:
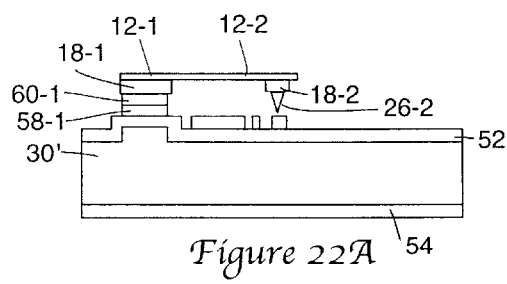
Figure 22B:
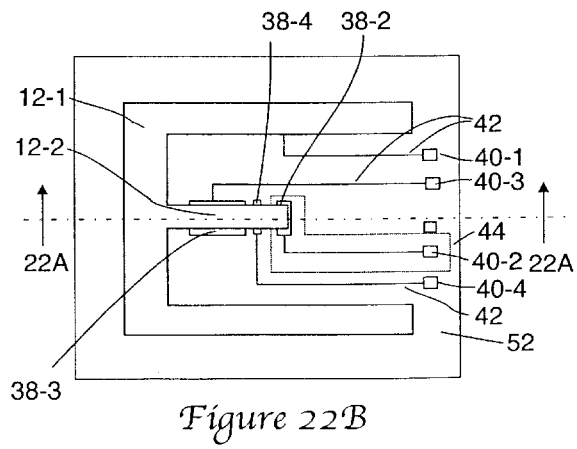
FIG. 22B shows the completed MEM sensor according to the second embodiment in plan sectional view.

Turning to FIG. 20, the cantilever beam forming portion 2 according to the second embodiment is now bonded to base portion 4. As is shown in FIG. 20, the two wafers 10 and 30' are brought into a confronting relationship so that their mating structure 18-1, 30-1, 58-1 and 60-1 are in alignment so that layers 18-1 and 60-1 properly mate with each other. Pressure and heat (preferably by applying a force of 5,000 N at 400° C. between three inch wafers 2, 4 having 1000 sensors disposed thereon) are applied so that eutectic bonding occurs between layers 18-1 and 60-1 as shown in FIG. 21. Thereafter, silicon wafer 10 is dissolved so that the MEM sensor structure shown in FIG. 22 is obtained. The p-type silicon layer 12 includes a portion 12-2 which serves as the cantilevered beam and another portion which is attached to the base portion 4 through the underlying layers. The gold contact 26-2 is coupled to pad 40-1 by elements 18-2, 12-2, 12-1, 18-1, 60-1, 58-1 and its associated ribbon conductor 42. If the bonding is done non-eutectically, then higher temperatures will be required.

Figure 23:
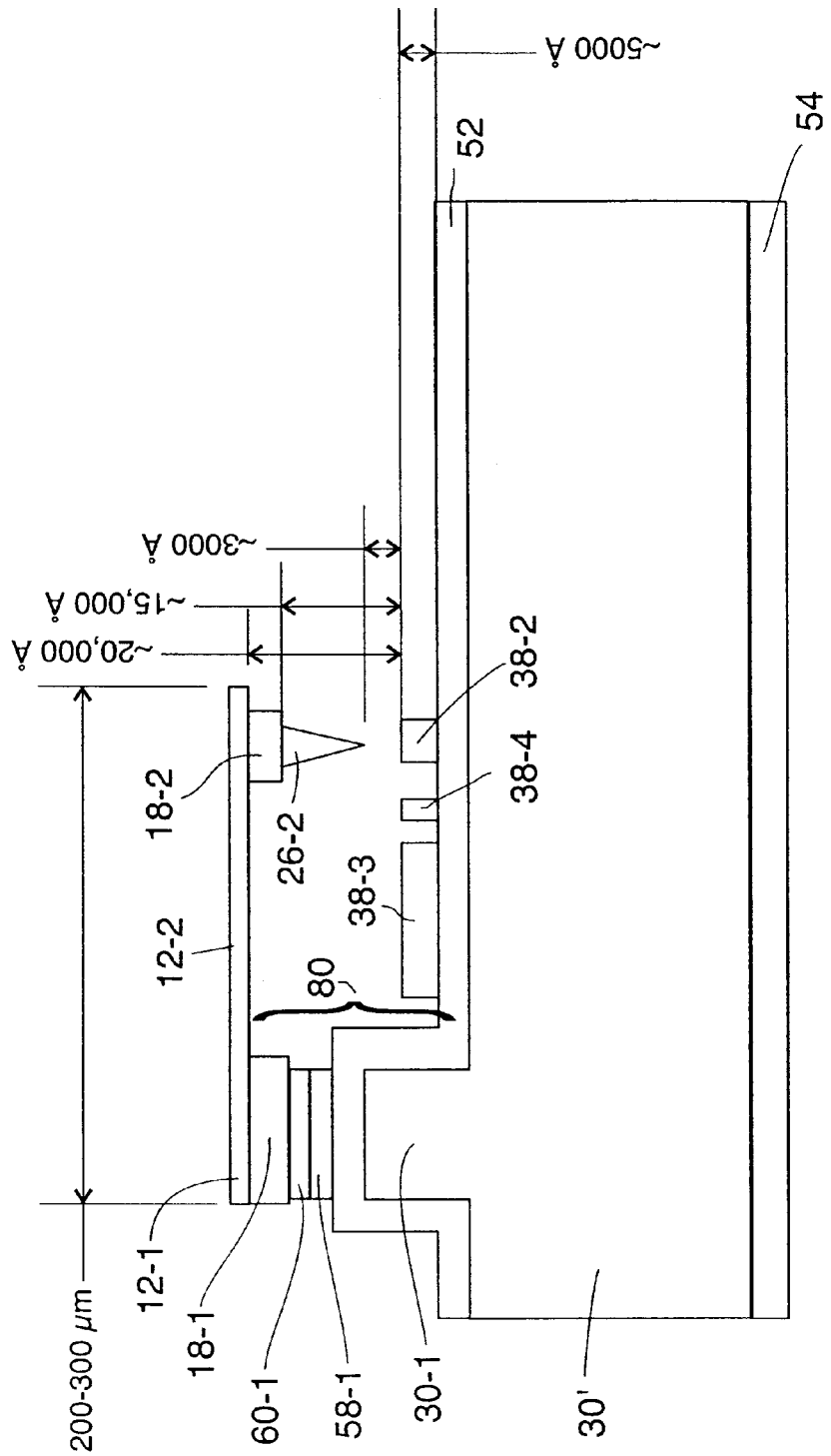

FIG. 23 is basically identical to FIG. 22, but shows the MEM sensor in somewhat more detail and the preferred dimensions of the MEM sensor are also shown on this figure.

It will be recalled that in both the first and second embodiment discussed above with respect to FIG. 4B, a layer of Ti/Pt/Au 18 was applied forming contacts 18-1 and 18-2 which were sintered in order to form an ohinic bond with Boron-doped cantilever 12. It was noted that sintering could be avoided by providing a ribbon conductor between contacts 18-1 and 18-2. Such a modification is now described in greater detail and is depicted starting with FIGS. 24A and 24B.

According to this modification, the Si epitaxial layer 12 formed on silicon wafer 10 may be (i) doped with Boron or (ii) may be either undoped or doped with other impurities. If undoped (or doped with other impurities), then a thin etch stop layer 11 is used between the Si device layer 12 and the silicon wafer 10. This configuration is called Silicon On Insulator (SOI). The etch stop layer 11, if used, is preferably a layer of $SiO_2$ having a thickness of about 1–2 $\mu$m. This etch stop layer 11 will be used to release the cantilevered beam from wafer 10. If layer 12 is doped with Boron, it is doped to reduce the resistivity of the epitaxial layer 12 to less than 0.05 Ω-cm. At that level of doping the epitaxial layer 12 can resist a subsequent EDP etch used to release the cantilevered beam from wafer 10.

Figure 37:
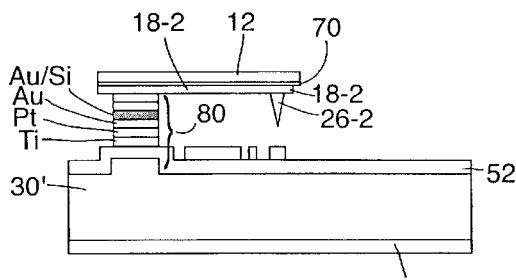
FIG. 37 depicts a side elevational section view of another embodiment of a MEM sensor, this embodiment having a preferably eutectic bond in a central region of its columnar support and a base structure having a silicon protrusion which forms part of the columnar support structure as in the embodiment of FIG. 36, but also utilizing a ribbon conductor on the cantilevered beam structure.

Optionally, the silicon wafer 10 with the doped or undoped Si epitaxial layer 12 formed thereon (as shown in FIGS. 24A and 24B) may be subjected to thermal oxidation to form a relatively thin layer of $SiO_2$ on the exposed surface of layer 12. Layer 12 is preferably about 1.2 $\mu$m thick (but it can be thinner or thicker depending upon the application). The thickness of the optional $SiO_2$ layer is preferably on the order of 0.2 $\mu$m. To arrive at this point, both major surfaces may be oxidized and the oxide stripped from the bottom layer, if desired. The optional oxide layer may be used to provide an even better barrier against the diffusion of Si from the beam into the Au of the tunneling tip formed at one end of the beam. This optional oxide layer may be used with any embodiment of the cantilevered beam, but is omitted from most of the figures for ease of illustration. It does appear, however, in FIGS. 37 and 41 and is identified there by element number 70.

Turning now to FIGS. 25A and 25B, a layer of photoresist 14 is then applied on layer 12 (or on the optional oxide layer, if present) and patterned preferably to assume the same "E" letter shape as the layer photoresist 14 discussed with reference to FIGS. 2A and 2B. The structure shown in FIGS. 25A and 25B is then subjected to a plasma etch which etches through layers 11 and 12 into the silicon substrate 10 by approximately 500 Å. Then a layer of photoresist 16 is applied and patterned as shown by FIGS. 26A and 26B. The layer 16 of photoresist is patterned to assume basically the same arrangement and configuration as layer 16 discussed with respect to FIGS. 3A and 3B except that an additional opening 16-5 is included communicating between openings 61-1 and 16-2 to provide for the formation of a ribbon conductor 18-5 when a layer 18 of metals, preferably Ti/Pt/Au, is subsequently deposited on photoresist 16. After depositing the layer 18, the photoresist 16 is removed lifting off the portions of the layer 18 formed thereon, leaving portions 18-1, 18-2 and 18-5 of layer 18 on the underlying layer 12, as shown in FIGS. 27A and 27B, or on the optional oxide layer, if present.

Figure 27A:
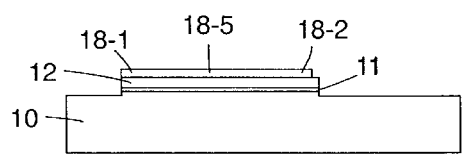
Figure 27B:
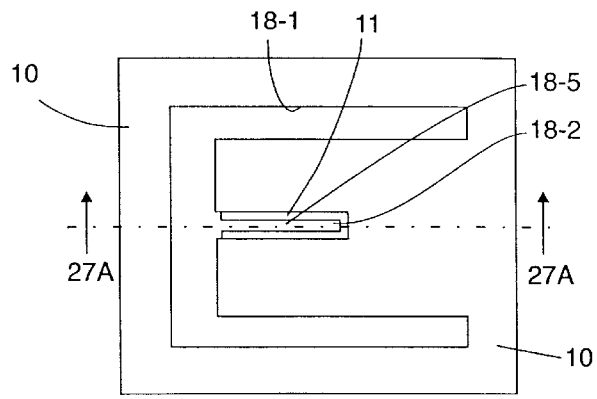
Figure 28A:
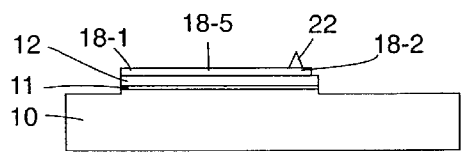
Figure 28B:
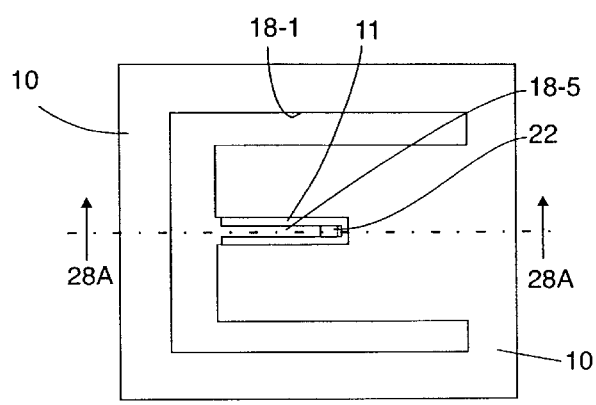
Figure 29A:
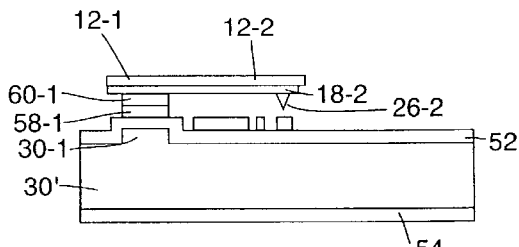
Figure 29B:
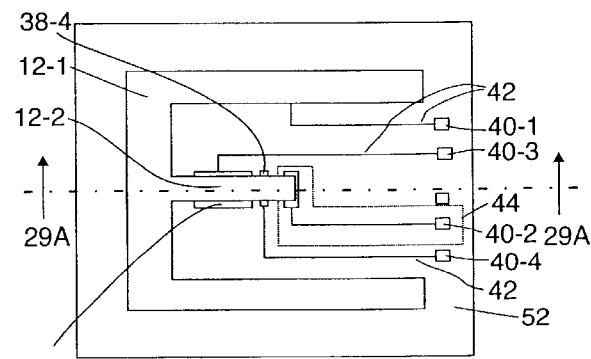

After arriving at the structure shown in FIGS. 27A and 27B, a tunneling tip 22 is added by appropriate masking and deposition of Au or a layer of Ti/Pt/Au, for example, thereby arriving at the structure shown by FIGS. 28A and 28B. Depending on the configuration utilized, a member 22-1 (see FIG. 6A) could be deposited at the same time so that the MEM sensor would be completed as previously described with reference to FIGS. 10 and 11. If instead the silicon base 30 is formed with a protrusion 30-1 (see FIG. 16A, for example), then the deposition of member 22-1 can be omitted and the MEM sensor can be completed as previously described with reference to FIGS. 20 and 21. After bonding the structure depicted by FIGS. 28A and 28B to the base structure 4 of FIGS. 19A and 19B and releasing the silicon wafer 10 from the cantilevered beam, the structure shown by FIGS. 29A and 29B is arrived at. The cantilevered beam 12 is preferably released by performing two plasma etches. The first etch dissolves wafer 10 and the second etch removes the etch stop layer 11.

Figure 30:
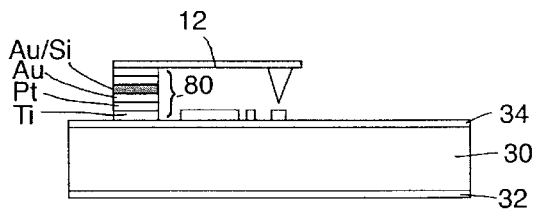
FIG. 30 depicts a side elevational section view of another embodiment of a MEM sensor, this embodiment having a preferably eutectic bond in a central region of its columnar support.
Figure 31:
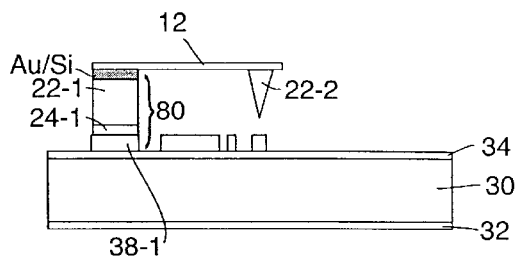
FIG. 31 depicts a side elevational section view of yet another embodiment of a MEM sensor, this embodiment having a preferably eutectic bond adjacent the cantilevered beam 12.

FIG. 30 shows yet another embodiment of a MEM sensor. In this case the MEM sensor is shown in its completed form. With the information already presented herein, those skilled in the art will not find it difficult to modify the detailed description already given to produce this embodiment and still further embodiments, all of which will now be discussed. In the embodiment of FIGS. 1A–12B the preferable eutectic bond occurs close to the silicon substrate 10 between layers 24-1 and 38-1. In the embodiment of FIG. 30, the preferable eutectic bond occurs closer to a center point in the supporting arm 80 between the Au and Au/Si layers. Otherwise this embodiment is similar to the first embodiment described with reference to FIGS. 1A–12B. In the embodiment of FIG. 31, the preferable eutectic bond occurs between the Au and Au/Si layers which are arranged close to the cantilevered beam 12 as opposed to close to base 4 as in the case of the first embodiment described with reference to FIGS. 1A–12B. In the case of the embodiments of FIGS. 30 and 31, the cantilevered beam 12 should have good conductivity so that it acts as a conduction path between contact 22-2 at the end of the beam 12 and contact 40-1 on the base 4 (See FIG. 12B). Preferably the resistivity of the boron doped silicon cantilevered beam 12 is less than 0.05 Ω-cm. Due to the low resistivity of the beam 12, EDP may be used to etch away substrate 10 (see FIGS. 10 and 11 and the related description). Alternatively, an SOI wafer could be used and the $SiO_2$ layer 11 (FIGS. 24A–28B) would be used as an etch stop layer to protect the beam 12 when etching away substrate 10.

Comparing the embodiments of FIGS. 10, 23, 29 and 30, the embodiments of FIGS. 23 and 29 are preferred since they only need a relatively thin metal mating layer and provide a more rigid Si post or protrusion 30-1 for better stability.

Figure 32:
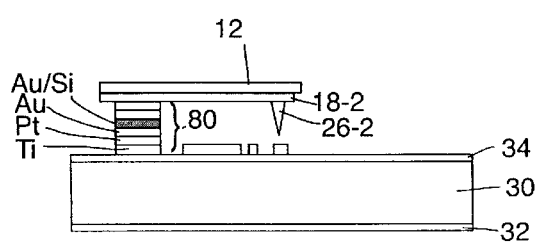
FIG. 32 depicts a side elevational section view of still another embodiment of a MEM sensor, this embodiment having a preferably eutectic bond in a central region of its columnar support as in the embodiment of FIG. 30, but also having a ribbon conductor on the cantilevered beam structure.
Figure 33:
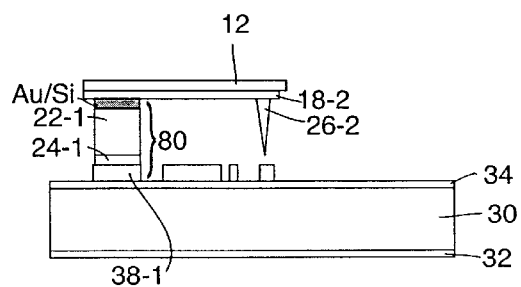
FIG. 33 depicts a side elevational section view of another embodiment of a MEM sensor, t this embodiment having a preferably eutectic bond adjacent the cantilevered beam structure as in the case of the embodiment of FIG. 31, but also having a ribbon conductor on the cantilevered beam structure.
Figure 34:
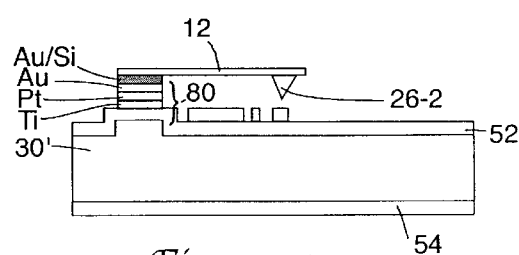
FIG. 34 depicts a side elevational section view of still another embodiment of a MEM sensor, this embodiment having a preferably eutectic bond adjacent the cantilevered beam, but also utilizing a base structure having a silicon protrusion which forms part of the columnar support structure.
Figure 35:
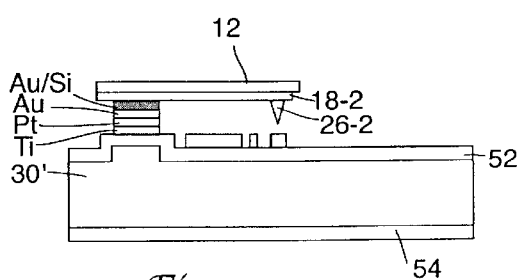
FIG. 35 depicts a side elevational section view of yet another embodiment of a MEM sensor, this embodiment having a preferably eutectic bond adjacent the cantilevered beam and utilizing a base structure having a silicon protrusion which forms part of the columnar support structure as in the case of the embodiment of FIG. 34, but also utilizing a ribbon conductor on the cantilevered beam structure.
Figure 36:
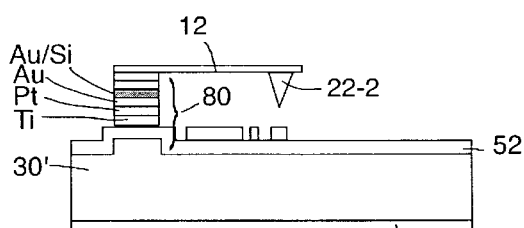
FIG. 36 depicts a side elevational section view of another embodiment of a MEM sensor, this embodiment having a preferably eutectic bond in a central region of its columnar support as in the embodiment of FIG. 30, but also utilizing a base structure having a silicon protrusion which forms part of the columnar support structure.

The embodiments of FIGS. 32 and 33 are similar to the embodiments of FIGS. 29 and 30, but these two embodiments make use of the ribbon conductor 18-5 described with reference to FIGS. 24A through 29B. For these embodiments, if layer is doped with Boron, the resistivity of the cantilevered beam 12 is preferably less than 0.05 Ω-cm. The ribbon conductor allows the use of higher resistivity silicon for the cantilevered beam 12. If layer 12 is doped with Boron, then the cantilevered beam can be released from wafer 10 using EDP as the etchant. Alternatively, an SIO construction can be utilized with a $SiO_2$ stop layer 11 (See FIGS. 24A–28B) utilized to protect the beam 12 while the substrate 10 is etched away.

The embodiments of FIGS. 34–37 are similar to the embodiment of FIGS. 29, 31, 30 and 32, respectively, except instead of using a planar substrate, a substrate with a silicon protrusion 30-1 is utilized as described with reference to the second embodiment (see FIGS. 13A–23 and the related description).

Generally speaking, the embodiments of FIGS. 13A–23 and 34–37 are preferred for a MEM sensor since these embodiments, which all utilize the a base substrate 30' with a silicon post or protrusion 30-1, are believed to give the resulting sensors and switches better mechanical stability.

The structure which has been described so far has been set up as a sensor. Those skilled in the art know not only how to utilize these structures as a sensor but also know how to modify these structures, when needed, to make them function as a switch. The sensor devices shown in the preceding figures are preferably used as accelerometers, although they can be used for other types of sensors (such as gyroscopes, magnetometers, etc.) or as switches, as a matter of design choice, and with appropriate modification when needed or desired.

Four embodiments of a switch version of a MEM device in accordance with the present invention will now be described with reference to FIGS. 38–41. In order to function as a switch, two metal pads 26-3 and 26-4 are deposited on the cantilevered beam structure 12 instead of a pointed contact 26-2. In these embodiments the cantilevered beam is preferably formed of undoped silicon. When the switch closes, the metal pad 26-4 bridges two contacts 38-5 and 38-6, which are deposited at the same time that layer 38 is deposited on the base structure 4. The ribbon conductor 18-5 described with reference to FIGS. 24A through 29B is utilized, due to the relatively high resistivity of undoped Si, to bring an electrical connection with metal pad 26-3 down to the base substrate 4. The switch is closed by imparting an electrostatic force on the cantilevered beam 12 by applying a voltage between metal pads 38-3 and 26-3. That voltage causes the metal pad 26-4 to make a circuit connecting contacts 38-5 and 38-6 when the metal pad 26-4 makes physical contact with those two contacts when the switch closes. Otherwise these embodiments are similar to the previously discussed embodiments. It should be noted, however, that since the cantilevered beam 12 is preferably formed of undoped silicon, the EDP etchant will not prove satisfactory. Instead the $SiO_2$ etch stop layer 11 described with reference to FIGS. 24A–29B is preferably used to protect the beam 12 when etching away substrate 10.

Figure 38:
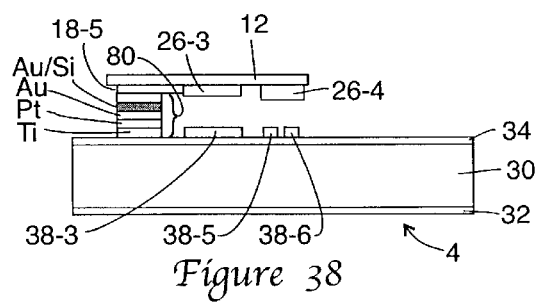
FIG. 38 depicts a side elevational section view of an embodiment of a MEM switch, this embodiment being similar to the sensor embodiment of FIG. 32, but being equipped with an additional pad which is used to apply electrostatic forces to the beam to close the switch.
Figure 39:
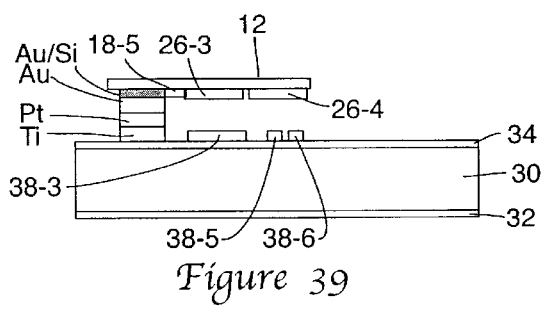
FIG. 39 depicts a side elevational section view of another embodiment of a MEM switch, this embodiment being similar to the switch embodiment of FIG. 38, but the preferably eutectic bond occurs adjacent the cantilevered beam as opposed in a central region of the columnar support.
Figure 40:
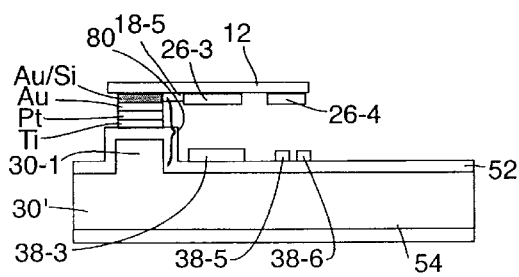
FIG. 40 depicts a side elevational section view of yet another embodiment of a MEM switch, this embodiment being similar to the switch embodiment of FIG. 39, but also utilizing a base structure having a silicon protrusion which forms part of the columnar support structure for the cantilevered beam.

In FIG. 38 the switch is formed on a generally planar base 4 and the cantilevered beam is supported by a column 80 formed of deposited metals and the Au/Si eutectic. The Au/Si eutectic is arranged towards the middle of the column in this embodiment. In the embodiment of FIG. 39 the Au/Si eutectic is arranged closer to the beam 12. In the embodiment of FIG. 40 the Au/Si eutectic layer is disposed next to the beam and in this embodiment the base structure 4 has a protrusion 30-1 which acts as a portion of the column 80 which supports the beam 12. Of the switch embodiments, the embodiment of FIG. 40 is preferred for the same reason that sensors with a protrusion 30-1 in their base structures 4 are also preferred, namely, it is believed to give the resulting sensors and switches better mechanical stability.

Figure 41:
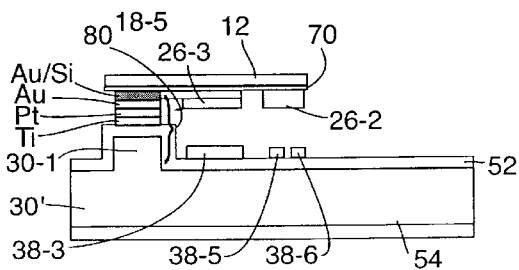
FIG. 41 depicts a side elevational section view of yet another embodiment of a MEM switch, this embodiment being similar to the switch embodiment of FIG. 40, but including an $SiO_2$ layer between the ribbon conductor and the Si of the cantilevered beam.

In FIG. 41 an $SiO_2$ layer 70 is shown disposed between beam 12 and layer 18. Layer 18 preferably is formed of layers of Ti, Pt and Au. The Pt acts as a diffusion barrier to the Si to keep it from migrating into the Au contacts. If layer 18 does not provide adequate protection for whatever metal is used in making contacts, then the use of a diffusion barrier such a $SiO_2$ layer 70 would be appropriate.

The structures shown in the drawings has been described in many instances with reference to a capital letter 'E'. However, this shape is not particularly critical, but it is preferred since it provides good mechanical support for the cantilevered structure formed primarily by beam portion of layer 12. Of course, the shape of the supporting structure or mating structure around cantilever beam 12 can be changed as a matter of design choice and it need not form the perimeter of the capital letter 'E', but can form any convenient shape, including circular, triangular or other shapes as desired.

In the embodiment utilizing a ribbon conductor on the cantilevered beam 12, the pads and contacts (e.g. 26-2 and 26-3) formed on the beam 12 are generally shown as being formed over the ribbon conductor 18-1, 18-2, 18-5. The ribbon conductor on the beam can be routed in any convenient fashion and could butt against or otherwise make contact with the other metal elements formed on the cantilevered beam 12 in which case elements such as 26-2 and 26-3 could be formed directly on the beam 12 itself.

The contacts at the distal ends: of the cantilevered beams are depicted and described as being conical or triangular. Those skilled in the art will appreciate that those contacts may have other configurations and may be flat in some embodiments.

Throughout this description are references to Ti/Pt/Au layers. Those skilled in the art will appreciate that this nomenclature refers to a situation where the Ti/Pt/Au layer comprises individual layers of Ti, Pt and Au. The Ti layer promotes adhesion, while the Pt layer acts as a barrier to the diffusion of Si from adjacent layers into the Au. Other adhesion layers such as Cr and/or other diffusion barrier layers such as a Pd could also be used or could alternatively be used. It is desirable to keep Si from migrating into the Au, if the Au forms a contact, since if Si diffuses into an Au contact it will tend to form $SiO_2$ on the exposed surface and, since $SiO_2$ is a dielectric, it has deleterious effects on the ability of the Au contact to perform its intended function. As such, a diffusion barrier layer such as Pt and/or Pd is preferably employed between an Au contact and adjacent Si material.

The nomenclature Au/Si or Au—Si refers a mixture of Au and Si. The Au and Si can be deposited as separate layers with the understanding that the Si will tend to migrate at elevated temperature into the Au to form an eutectic. However, for ease of manufacturing, the Au/Si eutectic is preferably deposited as a mixture except in those embodiments where the migration of Si into Au is specifically relied upon to form Au/Si.

Many different embodiments of a MEM device have been described. Most are sensors and some are switches. Many more embodiments can certainly be envisioned by those skilled in the art based the technology disclosed herein. But in all cases the base structure 4 is united with the cantilevered beam forming structure 2 by applying pressure and preferably also heat, preferably to cause an eutectic bond to occur between the then exposed layers of the two structures 2 and 4. The bonding may instead be done non-eutectically, but then higher temperatures must be used. Since it is usually desirable to reduce and/or eliminate high temperature fabrication processes, the bonding between the two structures 2 and 4 is preferably done eutectically and the eutectic bond preferably occurs between confronting layers of Si and Au/Si.

Having described the invention with respect to certain preferred embodiments thereof, modification will now suggest itself to those skilled in the art. The invention is not to be limited to the foregoing description, except as required by the appended claims.

What is claimed is:

1. A method of making a MEM tunneling sensor comprising the steps of:

(a) defining a cantilevered beam structure and a mating structure on a first substrate or wafer;

(b) forming at least one contact structure and a mating structure on a second substrate or wafer, the mating structure on the second substrate or wafer being of a complementary shape to the mating structure on the first substrate or wafer;

(c) positioning the mating structure of the first substrate or wafer into a confronting relationship with the mating structure of the second substrate or wafer;

(d) bonding a layer associated with said mating structure on the first substrate or wafer with a layer associated with the mating structure on the second substrate or wafer; and (e) removing at least a portion of the first substrate or wafer to release the cantilevered beam structure.

2. A method of making a MEM tunneling sensor as claimed in claim 1 wherein the second substrate or wafer is formed of silicon.

3. A method of making a MEM tunneling sensor as claimed in claim 2 wherein the silicon forming the second substrate or wafer is of a single crystalline structure.

4. A method of making a MEM tunneling sensor as claimed in claim 3 wherein the crystalline structure of the silicon is <100>.

5. A method of making a MEM tunneling sensor as claimed in claim 4 wherein the silicon is n-type.

6. A method of making a MEM tunneling sensor as claimed in claim 1 wherein the first substrate or wafer is formed of silicon.

7. A method of making a MEM tunneling sensor as claimed in claim 6 wherein the silicon forming the first substrate or wafer is of a single crystalline structure.

8. A method of making a MEM tunneling sensor as claimed in claim 7 wherein the crystalline structure of the silicon in the first substrate or wafer is <100>.

9. A method of making a MEM tunneling sensor as claimed in claim 8 wherein the silicon of the first substrate or wafer is n-type.

10. A method of making a MEM tunneling sensor as claimed in claim 1 wherein heat is applied together with pressure between the two substrates so as to cause an eutectic bond to occur between the two mating structures.

11. A method of making a MEM tunneling sensor as claimed in claim 1 wherein the cantilevered beam structure is formed by:

(a) forming an epitaxial layer of silicon on said first substrate or wafer, said epitaxial layer being doped;

(b) masking and etching the epitaxial layer of silicon to define a beam structure disposed on said first substrate or wafer; and (c) removing the first substrate or wafer by etching.

12. A method of making a MEM tunneling sensor as claimed in claim 11 wherein a contact is formed on an end of said beam structure by depositing a metal through a small opening in a temporary mask layer, the small opening being sufficiently small that the metal being deposited tends to overhang the small opening increasingly as the deposition of the metal proceeds whereby the contact being deposited through the small opening assumes an elongate shape of decreasing cross section as the deposition proceeds.

13. A method of making a MEM tunneling sensor as claimed in claim 11 wherein etching accomplished by ethylenediamine pyrocatechol as an etchant.

14. A method of making a MEM tunneling sensor as claimed in claim 11 wherein the epitaxial layer is doped with boron at a sufficient concentration to reduce the resistivity of the epitaxial layer to less than 0.05 Ω-cm.

15. A method of making a MEM tunneling sensor as claimed in claim 14 wherein a layer of metal is selectively deposited on said epitaxial layer and sintered at an elevated temperature to form first and second ohmic contacts on said epitaxial layer, said second ohmic contact being disposed near a distal end of the beam structure and the first ohmic contact forming the mating structure on the first substrate or wafer.

16. A method of making a MEM tunneling sensor as claimed in claim 15 wherein the layer of metal is formed of individual layers of Ti, Pt and Au.

17. A method of making a MEM tunneling sensor as claimed in claim 16 wherein a relatively thick layer of Ti/Pt/Au is deposited and then sintered on a relatively thin metal layer of Ti/Pt/Au, a first portion of the relatively thick layer of Ti/Pt/Au forming the mating structure on the first substrate or wafer and overlying said first ohmic contact and a second portion of the relatively thick layer of metal forming a pointed contact at said second ohmic contact.

18. A method of making a MEM tunneling sensor as claimed in claim 17 further including forming Ti/Pt/Au contacts on said second substrate or wafer, at least one of said contacts on the second substrate or wafer defining the mating structure on the second substrate or wafer.

19. A method of making a MEM tunneling sensor as claimed in claim 18 wherein the bonding occurs eutectically and the layer for producing an eutectic bond is provided by a layer of Au—Si eutectic deposited on the Ti/Pt/Au contact on said second substrate or wafer and/or by a layer of Au—Si eutectic deposited on first portion of the relatively thick layer of Ti/Pt/Au on the first substrate or wafer.

20. A MEM tunneling sensor assembly for making a MEM tunneling sensor therefrom, the assembly comprising:

(a) a beam structure and a mating structure defined on a first substrate or wafer;

(b) at least one contact structure and a mating structure defined on a second substrate or wafer, the mating structure on the second substrate or wafer being of a complementary shape to the mating structure on the first substrate or wafer; and (c) a pressure/heat sensitive bonding layer disposed on at least one of said mating structures for bonding the mating structure defined on the first substrate or wafer to mating structure on the second substrate or wafer in response to the application of pressure/heat therebetween.

21. A MEM tunneling sensor assembly as claimed in claim 20 wherein the second substrate or wafer is formed of silicon.

22. A MEM tunneling sensor assembly as claimed in claim 21 wherein the silicon forming the second substrate or wafer is of a single crystalline structure.

23. A MEM tunneling sensor assembly as claimed in claim 22 wherein the crystalline structure of the silicon is <100>.

24. A MEM tunneling sensor assembly as claimed in claim 23 wherein the silicon is n-type.

25. A MEM tunneling sensor assembly as claimed in claim 20 wherein the first substrate or wafer is formed of silicon.

26. A MEM tunneling sensor assembly as claimed in claim 25 wherein the silicon forming the first substrate or wafer is of a single crystalline structure.

27. A MEM tunneling sensor assembly as claimed in claim 26 wherein the crystalline structure of the silicon in the first substrate or wafer is <100>.

28. A MEM tunneling sensor assembly as claimed in claim 27 wherein the silicon of the first substrate or wafer is n-type silicon.

29. A MEM tunneling sensor assembly as claimed in claim 20 wherein a pointed contact is disposed on an end of said beam structure.

30. A MEM tunneling sensor assembly as claimed in claim 29 wherein the epitaxial layer is doped with Boron at a sufficient concentration to reduce the resistivity of the epitaxial layer to less than 0.05 Ω-cm.

31. A MEM tunneling sensor assembly as claimed in claim 30 further including first and second ohmic contacts on said epitaxial layer, said second ohmic contact being disposed near a distal end of the beam structure and said first ohmic contact forming the mating structure on the first substrate or wafer.

32. A MEM tunneling sensor assembly as claimed in claim 31 wherein the first and second ohmic contacts are formed of layers of Ti, Pt and Au.

33. A MEM tunneling sensor assembly as claimed in claim 32 wherein a relatively thick layer of Ti/Pt/Au is disposed on the first and second ohmic Ti/Pt/Au contacts, a first portion of the relatively thick layer of Ti/Pt/Au being disposed on said first ohmic Ti/Pt/Au contact and providing the mating structure on the first substrate and a second portion of the relatively thick layer of Ti/Pt/Au forming a pointed contact on said second ohmic Ti/Pt/Au contact.

34. A MEM tunneling sensor assembly as claimed in claim 32 further including Ti/Pt/Au contacts disposed on said second substrate or wafer, at least one of said contacts on the second substrate or wafer defining the mating structure on the second substrate or wafer.

35. A MEM tunneling sensor assembly as claimed in claim 34 wherein the bonding layer is provided by a layer of Au—Si eutectic disposed on the Ti/Pt/Au contact on said second substrate and/or by a layer of Au—Si eutectic disposed on the first portion of the relatively thick layer of Ti/Pt/Au on the first substrate or wafer.

36. A method of making a MEM tunneling sensor comprising the steps of:
   (a) defining a cantilevered silicon beam structure and a mating structure on a first silicon substrate or wafer;
   (b) forming at least one contact structure and a mating structure on a second silicon substrate or wafer, the mating structure on the second silicon substrate or wafer being of a complementary shape to the mating structure on the first silicon substrate or wafer;
   (c) positioning the mating structure of the first silicon substrate or wafer into a confronting relationship with the mating structure of the second silicon substrate or wafer; and
   (d) bonding a layer associated with said mating structure on the first silicon substrate or wafer with a layer associated with the mating structure on the second silicon substrate or wafer.

37. A method of making a MEM tunneling sensor as claimed in claim 36 wherein the silicon forming the first silicon substrate or wafer and forming the second silicon substrate or wafer is of a single crystalline structure.

38. A method of making a MEM tunneling sensor as claimed in claim 37 wherein the crystalline structure of the silicon is <100>.

39. A method of making a MEM tunneling sensor as claimed in claim 36 wherein the cantilevered silicon beam structure is doped with boron.

40. A method of making a MEM tunneling sensor as claimed in claim 39 wherein the first substrate or wafer is formed of n-type silicon and wherein the second substrate or wafer is formed of n-type silicon.

41. A method of making a MEM tunneling sensor as claimed in claim 36 wherein heat is applied together with pressure between the two substrates or wafers so as to cause an eutectic bond to occur between the two mating structures.

42. A method of making a MEM tunneling sensor as claimed in claim 30 wherein a contact is formed on an end of said beam structure by depositing a metal through a small opening in a temporary mask layer, the small opening being sufficiently small that the metal being deposited tends to overhang the small opening increasingly as the deposition of the metal proceeds whereby the contact being deposited through the small opening assumes an elongate shape of decreasing cross section as the deposition proceeds.

43. A method of making a MEM tunneling sensor as claimed in claim 36 wherein the cantilevered beam structure is formed by:
   (a) forming an epitaxial layer of silicon on said first substrate or wafer, said epitaxial layer being doped;
   (b) masking and etching the epitaxial layer of silicon to define a beam structure disposed on said first substrate or wafer; and
   (c) removing the first substrate or wafer by etching.

44. A method of making a MEM tunneling sensor as claimed in claim 43 wherein etching is accomplished by ethylenediamine pyrocatechol as an etchant.

45. A method of making a MEM tunneling sensor as claimed in claim 43 wherein the epitaxial layer is doped with boron at a sufficient concentration to reduce the resistivity of the epitaxial layer to less than 0.05 Ω-cm.

46. A method of making a MEM tunneling sensor as claimed in claim 43 wherein a layer of metal is selectively deposited on said epitaxial layer and sintered to form first and second ohmic contacts on said epitaxial layer, said second ohmic contact being disposed near a distal end of the beam structure and the first ohmic contact forming the mating structure on the first substrate or wafer.

47. A method of making a MEM tunneling sensor as claimed in claim 46 wherein the layer of metal is formed of individual layers of Ti, Pt and Au.

48. A method of making a MEM tunneling sensor as claimed in claim 47 wherein a relatively thick layer of Ti/Pt/Au is deposited and then sintered on a relatively thin metal layer of Ti/Pt/Au, a first portion of the relatively thick layer of Ti/Pt/Au forming the mating structure on the first substrate or wafer and overlying said first ohmic contact and a second portion of the relatively thick layer of metal forming a pointed contact at said second ohmic contact.

49. A method of making a MEM tunneling sensor as claimed in claim 48 further including forming Ti/Pt/Au contacts on said second substrate or wafer, at least one of said contacts on the second substrate or wafer defining the mating structure on the second substrate or wafer.

50. A method of making a MEM tunneling sensor as claimed in claim 49 wherein the bonding occurs eutectically and the layer, which effects an eutectic bond, is provided by a layer of Au—Si eutectic deposited on the Ti/Pt/Au contact on said second substrate or wafer and/or by a layer of Au—Si eutectic deposited on a first portion of the relatively thick layer of Ti/Pt/Au on the first substrate or wafer.

51. The method of making a MEM tunneling sensor as claimed in claim 36 further comprising the step of removing at least a portion of the first silicon substrate or wafer to release the cantilevered silicon beam structure.

* * * * *